(12) United States Patent
Hirayama et al.

(10) Patent No.: US 10,593,828 B2
(45) Date of Patent: Mar. 17, 2020

(54) ULTRAVIOLET LIGHT-EMITTING DIODE AND ELECTRIC APPARATUS PROVIDED WITH THE SAME

(71) Applicants: RIKEN, Saitama (JP); PANASONIC CORPORATION, Osaka (JP)

(72) Inventors: Hideki Hirayama, Saitama (JP); Masafumi Jo, Tokyo (JP); Takuya Mino, Osaka (JP); Norimichi Noguchi, Osaka (JP); Takayoshi Takano, Osaka (JP); Jun Sakai, Osaka (JP)

(73) Assignees: RIKEN, Saitama (JP); PANASONIC CORPORATION, Osaka (JP)

( * ) Notice: Subject to any disclaimer, the term of this patent is extended or adjusted under 35 U.S.C. 154(b) by 0 days.

(21) Appl. No.: 15/771,241

(22) PCT Filed: Oct. 25, 2016

(86) PCT No.: PCT/JP2016/004678
§ 371 (c)(1),
(2) Date: Apr. 27, 2018

(87) PCT Pub. No.: WO2017/073046
PCT Pub. Date: May 4, 2017

(65) Prior Publication Data
US 2018/0331250 A1    Nov. 15, 2018

(30) Foreign Application Priority Data

Oct. 30, 2015  (JP) ................................ 2015-214111

(51) Int. Cl.
*H01L 33/00* (2010.01)
*H01L 33/06* (2010.01)
*H01L 33/04* (2010.01)

(52) U.S. Cl.
CPC .......... *H01L 33/0075* (2013.01); *H01L 33/04* (2013.01); *H01L 33/06* (2013.01)

(58) Field of Classification Search
CPC ......... H01L 33/02; H01L 33/04; H01L 33/06; H01L 33/12; H01L 33/14; H01L 33/145;
(Continued)

(56) References Cited

U.S. PATENT DOCUMENTS

2005/0062054 A1    3/2005  Fujiwara et al.
2010/0219395 A1*   9/2010  Hirayama ............... H01L 33/06
                                                                  257/13
(Continued)

FOREIGN PATENT DOCUMENTS

JP    2005-093895 A    4/2005
JP    2011-054717 A    3/2011
(Continued)

OTHER PUBLICATIONS

Androulidaki et al., "Energy gaps and bowing parameters of InAlGaN ternary and quaternary alloys", phys. stat. sol. (c) 3, No. 6, pp. 1866-1869, 2006.
(Continued)

*Primary Examiner* — Tucker J Wright
*Assistant Examiner* — Scott Stowe
(74) *Attorney, Agent, or Firm* — Greenblum & Bernstein, P.L.C.

(57) ABSTRACT

A UV LED element, which is an exemplary ultraviolet light-emitting diode according to the present invention, includes an n-type conductive layer, a light-emitting layer, an electron block layer, and a p-type contact layer, all of which are arranged in this order. Bandgap energy of the electron block layer satisfies $E_{contact} \leq E_{EBL}$, where $E_{contact}$ designates bandgap energy of the p-type contact layer and $E_{EBL}$ designates the bandgap energy of the electron block
(Continued)

layer. The electric apparatus includes the UV LED element as a light source for emitting an ultraviolet ray.

10 Claims, 8 Drawing Sheets

(58) Field of Classification Search
CPC ............. H01L 33/0062; H01L 33/0066; H01L 33/007; H01L 33/0075
See application file for complete search history.

(56) References Cited

U.S. PATENT DOCUMENTS

| | | |
|---|---|---|
| 2013/0069034 A1 | 3/2013 | Hirayama |
| 2016/0005919 A1 | 1/2016 | Obata |

FOREIGN PATENT DOCUMENTS

| | | |
|---|---|---|
| WO | 2011/104969 A1 | 9/2011 |
| WO | 2014/123092 A1 | 8/2014 |

OTHER PUBLICATIONS

Jo et al., "Deep UV Light-emitting Diodes Containing a p-AlGaN Contacting Layer with High Al Content", The Institute of Electronics, Information and Communication Engineers, IEICE Technical Report, vol. 114, No. 336, pp. 77-80, 2014, with complete English translation.

Maeda et al., "Realization of High Efficiency Deep UV LED by using Transparent p-AlGaN Contact Layer", The Institute of Electronics, Information, and Communication Engineers, IEICE Technical Report, vol. 114, No. 329, pp. 87-90, 2013, with complete English translation.

Vurgaftman et al., "Band parameters for nitrogen-containing semiconductors", Journal of Applied Physics, 94, 3675, pp. 3678, 2003.

International Search Report from Patent Application No. PCT/JP2016/004678, dated Jan. 24, 2017.

International Preliminary Report on Patentability from Patent Application No. PCT/JP2016/004678, dated May 1, 2018.

European search report dated Oct. 26, 2018, in European patent family member EP16859284.8.

* cited by examiner p-GaN (y=0)

p-GaN (y=0)

p-AlGaN (y = 0.4)

p-AlGaN (y = 0.4)

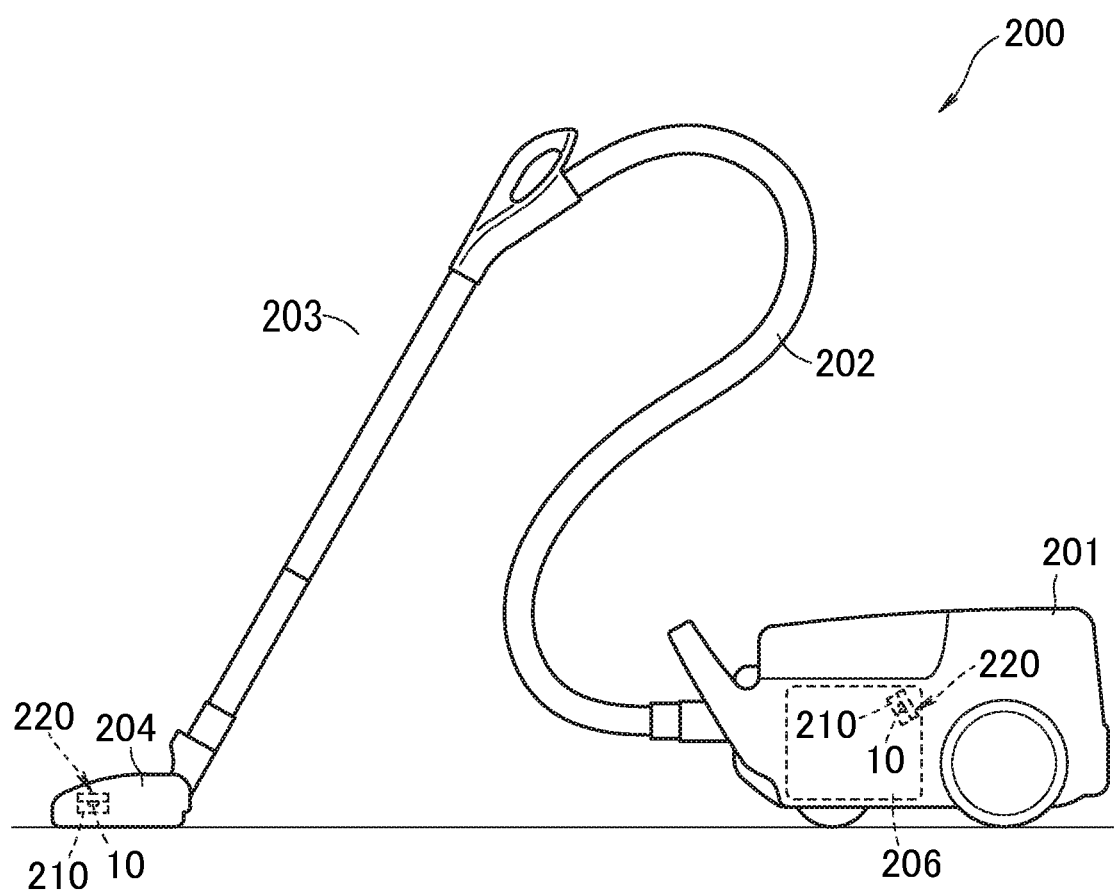

ULTRAVIOLET LIGHT-EMITTING DIODE AND ELECTRIC APPARATUS PROVIDED WITH THE SAME

TECHNICAL FIELD

The present invention relates to an ultraviolet light-emitting diode and an electric apparatus including the light-emitting diode, and more particularly relates to an ultraviolet light-emitting diode with improved carrier injection efficiency and an electric apparatus including such a light-emitting diode.

BACKGROUND ART

Blue light-emitting diodes have been extensively used in practice as solid-state light-emitting elements that use a nitride semiconductor. Meanwhile, ultraviolet light-emitting diodes (UV LEDs) using a nitride semiconductor have also been developed as solid-state light-emitting elements that emit a light ray falling within the ultraviolet range with a shorter wavelength (i.e., an ultraviolet ray). In the ultraviolet range, an ultraviolet ray falling within a deep ultraviolet range of 350 nm or less, inter alia, an ultraviolet ray falling within a wavelength range of about 260 nm to about 280 nm that forms part of a UV-C wavelength range, among other things, is expected to be used in a broad variety of applications, including sterilization, water disinfection, and medical treatment. Thus, to meet such a demand, LEDs emitting an ultraviolet ray falling within the UV-C wavelength range (i.e., so-called "deep ultraviolet LEDs") are also under development. A deep ultraviolet LED with a typical configuration uses either a sapphire substrate or an AlN single crystal substrate, and includes a multilayer structure of aluminum gallium nitride (AlGaN) based semiconductors including aluminum (Al), gallium (Ga), and nitrogen (N) as major constituent elements and also sometimes including indium (In) as an additional element. Research and development are under way to further increase the output of deep ultraviolet LEDs. As a result of such efforts, deep ultraviolet LEDs, operating at an ultraviolet ray output of about 10 mW, have also been used in practice these days.

One of technical challenges confronted by deep ultraviolet LEDs is that their luminous efficacy still has room for improvement. Indices to the luminous efficacy include external quantum efficiency (EQE). The external quantum efficiency is defined by dividing the number of photons released per unit time from a deep ultraviolet LED into the external space by the number of carriers per unit time that form a drive current. This external quantum efficiency is represented by the product of the three factors, namely, internal quantum efficiency (IQE), carrier injection efficiency (INJ), and light extraction efficiency (LEE). That is to say, if the external quantum efficiency, internal quantum efficiency, carrier injection efficiency, and light extraction efficiency are represented by $\eta_{EQE}$, $\eta_{IQE}$, $\eta_{INJ}$, and $\eta_{LEE}$, respectively, the following equation $$\eta_{EQE} = \eta_{IQE} \times \eta_{INJ} \times \eta_{LEE}$$

is satisfied.

As a result of the development that has been carried out extensively, among those three factors of deep ultraviolet LEDs, the internal quantum efficiency has been improved significantly, and the light extraction efficiency has also been enhanced. Thus, improvement of the carrier injection efficiency is an urgent task to solve. In the case of deep ultraviolet LEDs, in particular, p-type AlGaN with an increased aluminum mole fraction is adopted as a material for a p-type layer in order to widen the bandgap determining the photon energy of emission and to improve the light extraction efficiency by increasing the transmittance of non-light-emitting layers to an ultraviolet ray emitted from the light-emitting layer. Such a deep ultraviolet LED, however, has carrier injection efficiency which is difficult to improve. This problem arises partly because an Mg acceptor exhibits too high activation energy and too intense self-compensation effect in a p-type layer to increase the hole concentration easily.

One of the techniques for improving the carrier injection efficiency by overcoming the problem involved with the use of p-type AlGaN to form a pn junction is to interpose an electron block layer (EBL), of which the composition provides a wide bandgap, between the light-emitting layer and the p-type contact layer. A technique for adopting a multi-quantum barrier (MQB) layer as a form of the EBL has also been known. In a deep ultraviolet LED, among other things, interposing the MQB layer produces multiple reflections of electron matter waves, which contribute to increasing a substantial height of a barrier. Thus, even if such a p-type AlGaN layer, of which the composition has an aluminum mole fraction that is too high to increase the hole concentration and eventually the barrier height of the EBL easily, is adopted, it is still easy for such a deep ultraviolet LED to ensure the EBL function (see Patent Literature 1).

CITATION LIST

Patent Literature

Patent Literature 1: WO 2011/104969 A1

SUMMARY OF INVENTION

The present inventors have been searching for a technique for overcoming the low carrier injection efficiency problem with UV LEDs. In the course of such search, the present inventors noticed the fact that even a UV LED with an EBL, implemented as an MQB layer, for example, often failed to operate as expected.

It is therefore an object of the present invention to provide a UV LED with improved external quantum efficiency, and thereby contribute to enhancing the performance of electric apparatuses including the UV LED, by providing essential measures for improving the carrier injection efficiency.

The present inventors looked into circumstances where adopting some EBL, such as an MQB layer or a single barrier layer, failed to improve the carrier injection efficiency as expected. As a result, the present inventors discovered that the carrier injection efficiency heavily depends on a valence band offset to be determined relatively between the EBL and a p-type contact layer including an $Al_yGa_{1-y}N$ layer (where $0 \leq y \leq 1$). The present inventors also believed it imperative to do an intensive research to observe exactly how the EBL function would vary depending on the aluminum mole fraction y of the $Al_yGa_{1-y}N$ layer (where $0 \leq y \leq 1$) of the p-type contact layer. Thus, the present inventors carried out, using a computer, numerical simulation for obtaining the band lineup and carrier current of an LED adopting AlGaN while varying the aluminum mole fraction y of the $Al_yGa_{1-y}N$ layer (where $0 \leq y \leq 1$) serving as a p-type contact layer in contact with the EBL, thus perfecting our invention based on the results.

Specifically, an ultraviolet light-emitting diode according to an aspect of the present invention includes: an n-type conductive layer including an $In_{x1}Al_{y1}Ga_{1-x1-y1}N$ layer (where $0 \le x1 < 1$ and $0 < y1 \le 1$); a light-emitting layer, an electron block layer including an $In_{x2}Al_{y2}Ga_{1-x2-y2}N$ layer (where $0 \le x2 < 1$ and $0 < y2 \le 1$); and a p-type contact layer including an $In_{x3}Al_{y3}Ga_{1-x3-y3}N$ layer (where $0 \le x3 < 1$ and $0 < y3 < 1$), all of which are arranged in this order. The ultraviolet light-emitting diode satisfies $E_{contact} \le E_{EBL}$, where $E_{contact}$ designates bandgap energy of the p-type contact layer and $E_{EBL}$ designates bandgap energy of the electron block layer.

An ultraviolet light-emitting diode according to another aspect of the present invention includes: an n-type conductive layer including an $In_{x1}Al_{y1}Ga_{1-x1-y1}N$ layer (where $0 \le x1 < 1$ and $0 < y1 \le 1$); a light-emitting layer; an electron block layer including an $In_{x2}Al_{y2}Ga_{1-x2-y2}N$ layer (where $0 \le x2 < 1$ and $0 < y2 \le 1$); and a p-type contact layer including an $In_{x3}Al_{y3}Ga_{1-x3-y3}N$ layer (where $0 \le x3 < 1$ and $0 < y3 < 1$), all of which are arranged in this order. The ultraviolet light-emitting diode has a hole barrier height of 300 meV or less. The hole barrier height is defined by an energy difference between a maximum value of valence band energy of the electron block layer and a quasi-Fermi level value for holes.

BRIEF DESCRIPTION OF DRAWINGS

FIG. 2A is a band diagram illustrated with respect to levels in the thickness direction for a multilayer stack, including a p-type contact layer implemented as a p-type $Al_yGa_{1-y}N$ layer with an aluminum mole fraction y=0, and showing results of simulation of the UV LED according to the embodiment of the present invention, while

FIG. 3A is a band diagram illustrated with respect to levels in the thickness direction for a multilayer stack, including a p-type contact layer implemented as a p-type $Al_yGa_{1-y}N$ layer with an aluminum mole fraction y=0.4, and showing results of simulation of the UV LED according to the embodiment of the present invention, while

FIG. 4A is a band diagram illustrated with respect to levels in the thickness direction for a multilayer stack, including a p-type contact layer implemented as a p-type $Al_yGa_{1-y}N$ layer with an aluminum mole fraction y=0.8, and showing results of simulation of the UV LED according to the embodiment of the present invention, while

FIG. 5A is a band diagram illustrated with respect to levels in the thickness direction for a multilayer stack, including a p-type contact layer implemented as a p-type $Al_yGa_{1-y}N$ layer with an aluminum mole fraction y=1.0, and showing results of simulation of the UV LED according to the embodiment of the present invention, while

FIG. 10 schematically illustrates a configuration for a vacuum cleaner as an exemplary electric apparatus according to the embodiment of the present invention.

DESCRIPTION OF EMBODIMENTS

Embodiments of an ultraviolet light-emitting diode (hereinafter referred to as a "UV LED element") according to the present invention will now be described with reference to the accompanying drawings. In the following description, any pair of portions or elements illustrated on multiple different drawings and having substantially the same function will be designated by the same reference sign unless otherwise stated. It should also be noted that the structures illustrated on the respective drawings are not to scale among themselves.

1. CONFIGURATION OF UV LED ELEMENT

Figure 1:
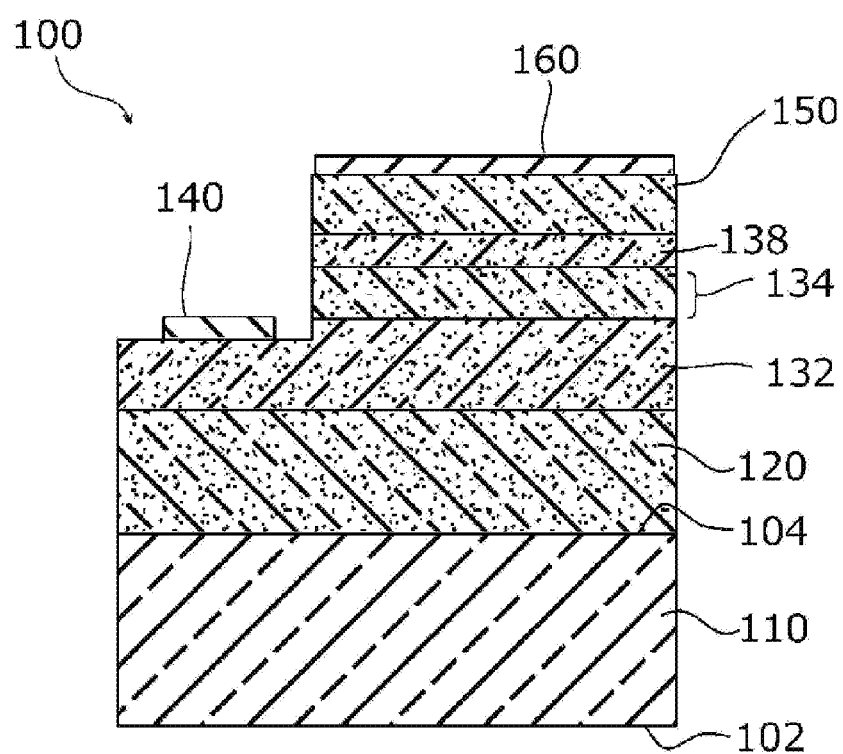
FIG. 1 is a schematic cross-sectional view illustrating a schematic configuration for a UV LED (which may be hereinafter referred to as a "UV LED element") according to an embodiment of the present invention.

FIG. 1 is a schematic cross-sectional view illustrating a schematic configuration for a UV LED element according to the present embodiment. In this UV LED element 100, a buffer layer 120 made of AlN crystals, for example, has been epitaxially grown on a first surface 104 of a generally flat-plate sapphire substrate 110, which is typically made of $\alpha$-$Al_2O_3$ single crystals. Also, in this UV LED element 100, an n-type conductive layer 132, a light-emitting layer 134, and an electron block layer (EBL) 138 have been epitaxially grown so as to be stacked in this order. In this case, the buffer layer 120, n-type conductive layer 132, light-emitting layer 134, and EBL 138 are vertically arranged in this order on the first surface 104 of the sapphire substrate 110. The n-type conductive layer 132 is in contact with the buffer layer 120. The n-type conductive layer 132, the light-emitting layer 134, and the EBL 138 each typically have a composition consisting essentially of either AlGaN or AlGaN very lightly doped with some dopant elements (e.g., Si to impart n-type conductivity or Mg to impart p-type conductivity). An n-side electrode 140 is electrically connected to the n-type conductive layer 132. The n-side electrode 140 is arranged on an exposed portion of the n-type conductive layer 132. On the other hand, a p-type contact layer 150 is stacked on the EBL 138 and a p-side electrode 160 is arranged on the p-type contact layer 150. The p-side electrode 160 is also used as an optical reflector. The p-side electrode 160 establishes electrical connection with (i.e., is electrically connected to) the EBL 138 via the p-type contact layer 150. This UV LED element 100 emits an ultraviolet ray through a light extraction surface 102, which is a second surface of the sapphire substrate 110.

Each of the buffer layer 120, n-type conductive layer 132, light-emitting layer 134, EBL 138, and p-type contact layer 150 may be epitaxially grown with a metalorganic vapor phase epitaxy (MOVPE) system. In that case, various parameters, including a substrate temperature, V/III ratio, flow rates of respective source gases, and growth pressures, may be set appropriately. As used herein, the "V/III ratio" is the ratio of the molar flow rate [µmol/min] of a source gas of N as a group V element to the molar flow rate [µmol/min] of a source gas for a group III element (such as an Al source gas, a Ga source gas, or an In source gas).

The n-type conductive layer 132 is an AlGaN layer doped with Si to impart n-type conductivity, i.e., an AlGaN; Si layer. In other words, the n-type conductive layer 132 is an n-type AlGaN layer. Under conditions to be adopted for calculations (hereinafter referred to as "typical conditions") in the simulation to be described later, the n-type conductive layer 132 may be an $Al_{0.5}Ga_{0.46}N$; Si layer with a thickness of 100 nm, for example. The light-emitting layer 134 may have a multi-quantum well (MQW) multilayer structure. Under the typical conditions, the light-emitting layer 134 has a periodic structure with three quantum wells (or well layers). More specifically, the light-emitting layer 134 may have a structure in which three well layers, each being made of $Al_{0.34}Ga_{0.66}N$ with a thickness of 2 nm, and two barrier layers, each being made of $Al_{0.54}Ga_{0.46}N$ with a thickness of 4 nm, are alternately stacked upon each other. The MQW multilayer structure further includes a spacer layer stacked on a well layer most distant from the n-type conductive layer 132. Under the typical conditions, an $Al_{0.54}Ga_{0.46}N$ layer with a thickness of 10 nm is adopted as the spacer layer. The MQW multilayer structure of the light-emitting layer 134 may have such an internal structure.

The EBL 138 and the p-type contact layer 150 are each an AlGaN layer doped with Mg to impart p-type conductivity, i.e., an AlGaN; Mg layer. In other words, the EBL 138 and the p-type contact layer 150 are p-type AlGaN layers. Of the EBL 138 and the p-type contact layer 150, the EBL 138 is a single AlGaN; Mg layer, of which the aluminum mole fraction has been increased to have a wider bandgap, for example. In implementation, optionally, the EBL 138 may be configured as an MQB layer. Under the typical conditions, the EBL 138 is implemented as an $Al_{0.9}Ga_{0.1}N$ layer with a thickness of 16 nm. Also, under the typical conditions, the p-type contact layer 150 is implemented as an $Al_yGa_{1-y}N$ layer with a thickness of 100 nm. In the simulation to be described later, the operation will be inspected with the band offset to be determined relatively between the EBL 138 and the p-type contact layer 150 changed by varying the aluminum mole fraction y of the p-type $Al_yGa_{1-y}N$ layer, serving as the p-type contact layer 150, within the range $0 \le y \le 1$.

The n-type conductive layer 132 has been doped with Si such that its concentration will have an appropriate level. Under the typical conditions, the Si doping concentration of the n-type conductive layer 132 may be $5 \times 10^{18}$ cm$^{-3}$. The p-type layers (namely, the EBL 138 and the p-type contact layer 150) have been doped with Mg such that its concentration will have an appropriate level. Under the typical conditions, the Mg doping concentration of the p-type layers may be $3 \times 10^{19}$ cm$^{-3}$.

2. SIMULATION

The present inventors carried out, using a computer, numerical simulation of how much the carrier injection efficiency would be improved if the above-described configuration for the UV LED element 100 was adopted. To perform this numerical simulation, the present inventors adopted band design software for LED elements (called "SiLENSe" produced by STR Group, Inc., Sankt Petersburg, Russia). Also, as a premise for carrying out the numerical simulation, assumptions were made that every AlGaN layer was lattice-matched with $Al_{0.54}Ga_{0.46}N$ and that ohmic contact was established between the n-type conductive layer 132 and the n-side electrode 140 and between the p-type contact layer 150 and the p-side electrode 160. The other conditions were in conformity with the typical conditions described above. As used herein, "every AlGaN layer" refers to the AlGaN layer serving as the n-type conductive layer 132, the light-emitting layer 134, the EBL 138, or the p-type contact layer 150. In the UV LED element 100, two types of carriers, namely, electrons and holes, are injected into the well layers of the light-emitting layer 134.

FIGS. 2A-5B show results of simulation of the UV LED according to this embodiment. These results were obtained with the aluminum mole fraction y of the p-type $Al_yGa_{1-y}N$ layer serving as the p-type contact layer 150 varied from zero to one, namely, y=0 (in FIGS. 2A and 2B), y=0.4 (in FIGS. 3A and 3B), y=0.8 (in FIGS. 4A and 4B), and y=1.0 (in FIGS. 5A and 5B). FIGS. 2A, 3A, 4A, and 5A are band diagrams illustrated with respect to levels in the thickness direction of the UV LED 100, showing band profiles of electrons, quasi-Fermi levels ($E_{Fn}$) of electrons, and quasi-Fermi levels ($E_{Fp}$) of holes. On the other hand, FIGS. 2B, 3B, 4B, and 5B show current density distributions, more specifically, current density distributions of electrons and current density distributions of holes. In FIGS. 2A-5B, the abscissa z is a coordinate for the thickness direction of a multilayer stack including the n-type conductive layer 132, the light-emitting layer 134, the EBL 138, and the p-type contact layer 150, and more specifically represents the distance from a reference plane, which may be defined by the interface between the buffer layer 120 and the n-type conductive layer 132. The EBL 138 and the p-type contact layer 150 occupy the range where 124 nm$\le z \le$140 nm. The p-type contact layer 150 occupies the range where 140 nm$\le z \le$240 nm. The numerical simulation was carried out on the condition that the current density was fixed at 10A/cm$^2$ and the Auges process was also taken into account.

As shown in FIGS. 2A, 3A, 4A, and 5A, the band profile, the quasi-Fermi level ($E_{Fn}$) of electrons, and the quasi-Fermi level ($E_{Fp}$) of holes varied significantly according to the aluminum mole fraction y of the p-type contact layer 150. In the p-type contact layer 150, as the aluminum mole fraction y increases, the activation energy of an Mg acceptor increases. Thus, the quasi-Fermi level $E_{Fp}$ of holes of the p-type contact layer 150 rises with respect to the valence band edge (see FIGS. 2A, 3A, 4A, and 5A). In the meantime, the hole concentration of the p-type contact layer 150 decreases monotonically from $1\times10^{18}$ cm$^{-3}$ (in the case of p-type GaN) to $3\times10^{15}$ cm$^{-3}$ (in the case of p-type AlN) as the aluminum mole fraction y increases.

Figure 2A:
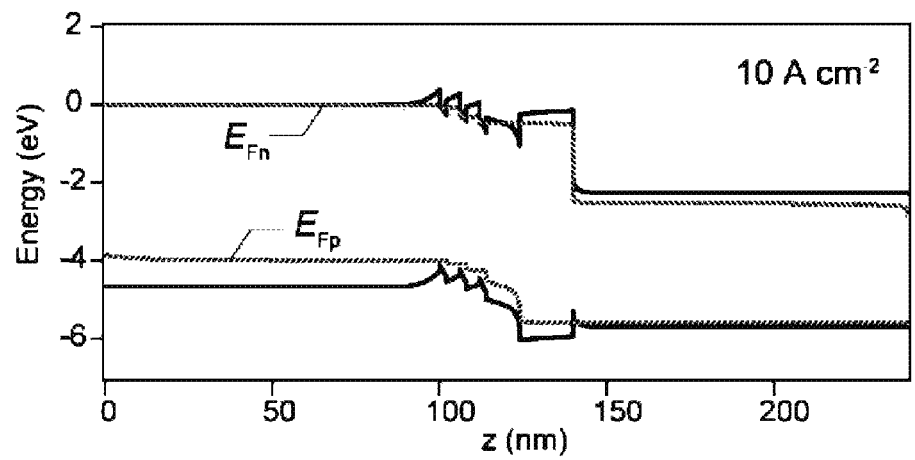
Figure 2B:
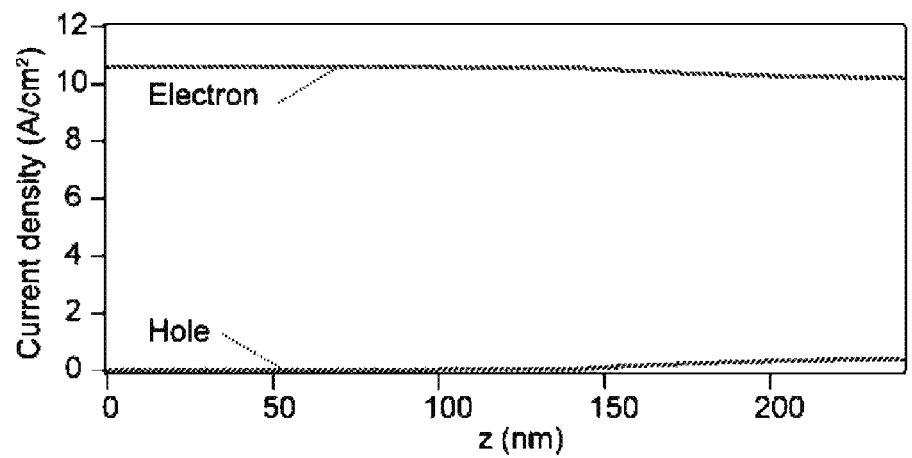
FIG. 2B is a graph showing a current density distribution with respect to levels in the thickness direction for the multilayer stack, including the p-type contact layer implemented as the p-type $Al_yGa_{1-y}N$ layer with an aluminum mole fraction y=0, and showing results of simulation of the UV LED according to the embodiment of the present invention.
Figure 5A:
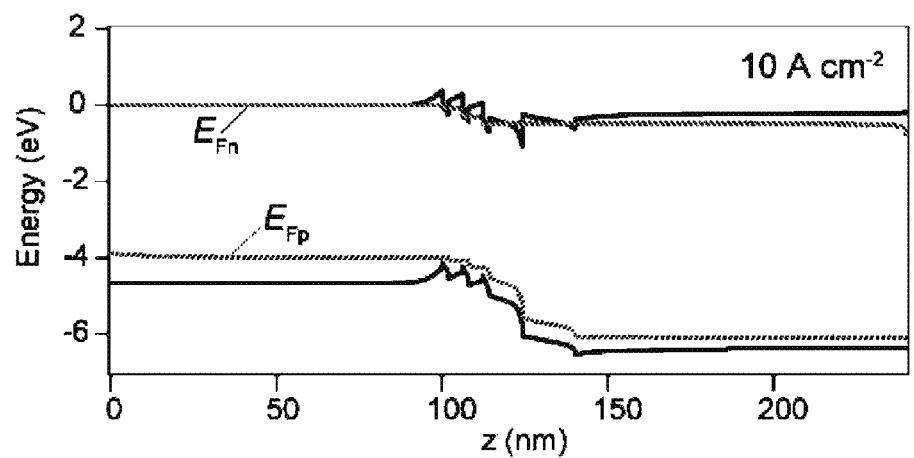
Figure 5B:
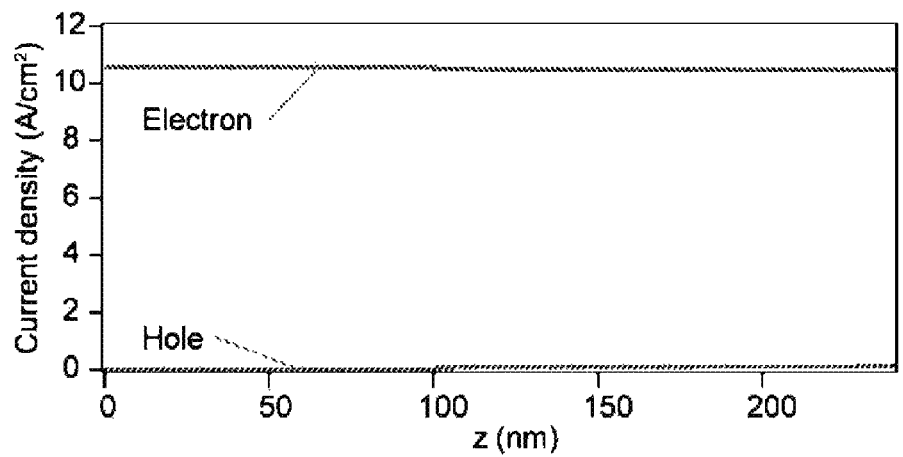
FIG. 5B is a graph showing a current density distribution with respect to levels in the thickness direction for the multilayer stack, including the p-type contact layer implemented as the p-type $Al_yGa_{1-y}N$ layer with an aluminum mole fraction y=1.0, and showing results of simulation of the UV LED according to the embodiment of the present invention.

In contrast, the injection efficiency of carriers into the light-emitting layer 134 does not change monotonically with an increase in the aluminum mole fraction y of the p-type contact layer 150. If the p-type contact layer 150 is made of p-type GaN (i.e., when aluminum mole fraction y=0) as shown in FIGS. 2A and 2B, then the UV LED has so low hole injection efficiency that electrons and holes hardly recombine with each other. Thus, in the UV LED, most of an electron current and most of a hole current pass through the light-emitting layer 134 between the n-side electrode 140 and the p-side electrode 160. That is why the UV LED has low carrier injection efficiency. In the UV LED, as the aluminum mole fraction y of the p-type contact layer 150 increases from zero, carriers (electrons and holes) tend to recombine with each other more and more easily (i.e., the probability of recombination increases), thus improving the carrier injection efficiency (see FIG. 3B). Then, when the aluminum mole fraction y of the p-type contact layer 150 reaches 0.8 in the UV LED, almost all carriers (electrons and holes) injected into the light-emitting layer 134 recombine with each other at quantum wells, and the carrier injection efficiency becomes closer to one (see FIG. 4B). In the UV LED, however, when the aluminum mole fraction y of the p-type contact layer 150 becomes excessive (e.g., when y=1 in this case), the hole injection efficiency decreases steeply and the carrier injection efficiency declines significantly as shown in FIG. 5B.

Figure 6:
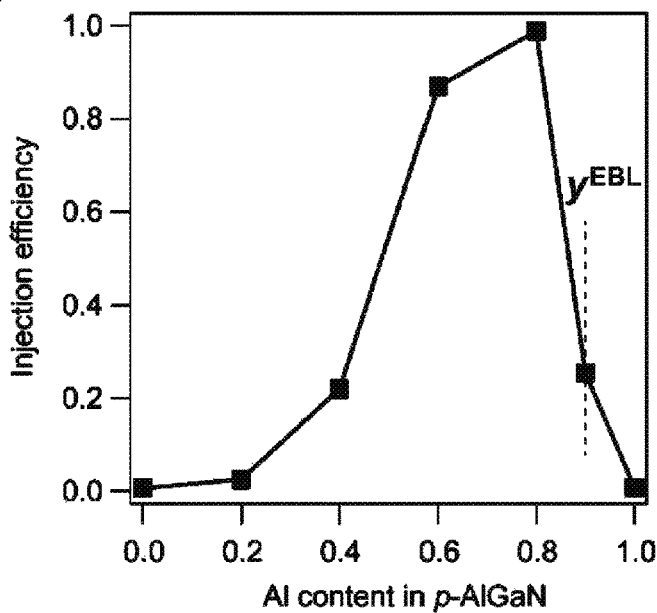
FIG. 6 is a graph showing summarized results of simulation of the UV LED according to the embodiment of the present invention.

FIG. 6 is a graph summarizing these results of simulation. In FIG. 6, the abscissa represents the aluminum mole fraction y of the p-type contact layer 150, and the ordinate represents the carrier injection efficiency. In FIG. 6, $y^{EBL}$ is the aluminum mole fraction y of 0.9 of the EBL 138 adopted in the simulation. As described above, as the aluminum mole fraction y of the p-type contact layer 150 is increased from zero, the carrier injection efficiency increases superlinearly with respect to the aluminum mole fraction y to become maximum at a point where y=0.8. Also, in the vicinity of the point where the aluminum mole fraction y becomes equal to or greater than the value $y^{EBL}$ of the EBL 138, the carrier injection efficiency decreases steeply. This result clearly reveals that from the standpoint of hole injection efficiency, the p-type contact layer 150 made of AlGaN (in other words, the p-type contact layer 150 including an Al$_y$Ga$_{1-y}$N layer) may have an optimum aluminum mole fraction y.

3. ANALYSIS

Analysis of these results of simulation led the present inventors to the conclusion that a major parameter determining the hole injection efficiency should be the hole barrier height in the EBL 138. As used herein, the hole barrier height is defined to be "the energy difference between the maximum value of the valence band energy of the EBL 138 and the quasi-Fermi level ($E_{Fp}$) value of holes." The barrier height depends on the level in the thickness direction of the EBL 138, and therefore, a geometric mean over the entire thickness of the EBL 138 is adopted.

Figure 7:
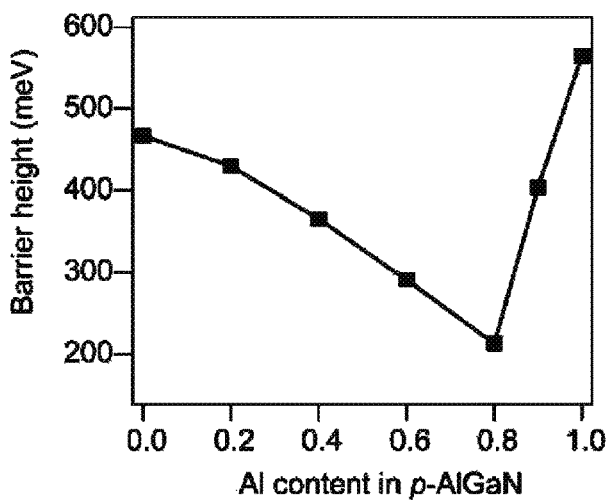
FIG. 7 is a graph showing the dependence of the hole barrier height on the aluminum mole fraction of a p-type contact layer, which was obtained as a result of the simulation of the UV LED according to the embodiment of the present invention.
Figure 8:
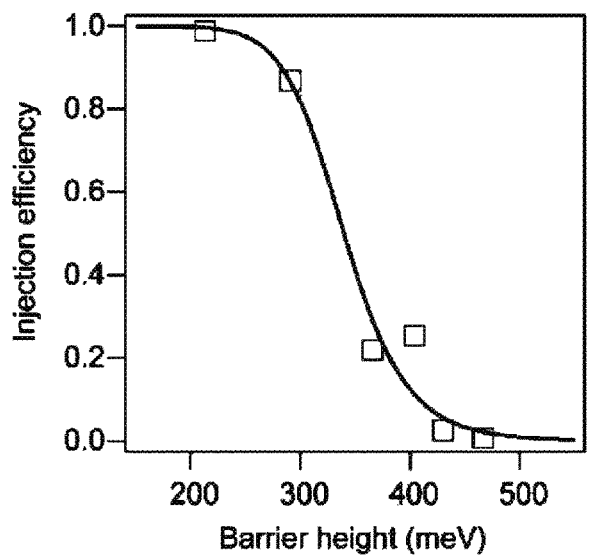
FIG. 8 is a graph showing the dependence of the carrier injection efficiency on the hole barrier height according to the embodiment of the present invention.

FIG. 7 is a graph showing the dependence of the hole barrier height on the aluminum mole fraction y of the p-type contact layer 150, which was obtained as a result of the simulation described above. In FIG. 7, shown are multiple hole barrier heights for p-type contact layers 150 with different aluminum mole fractions y. As the aluminum mole fraction y increases, the barrier height decreases to reach a minimum value when y=0.8. It can be said that this tendency suggests correlation with the relationship between the aluminum mole fraction y and the carrier injection efficiency shown in FIG. 6. Thus, the carrier injection efficiency is plotted in FIG. 8 as a function of the barrier height. The curve is shown in FIG. 8 for easy understanding. Even though the carrier injection efficiency exhibited concave down dependence on the aluminum mole fraction y as shown in FIG. 6 and the hole barrier height exhibited concave up dependence on the aluminum mole fraction y as shown in FIG. 7, rather linear uniqueness was observed between the carrier injection efficiency and the hole barrier height as shown in FIG. 8. This indicates that the hole barrier height becomes a reliable index to the hole injection efficiency. In other words, it can be said that the barrier height may be regarded as a variable representing the value of the carrier injection efficiency via the hole injection efficiency. In the case of the UV LED, the present inventors confirmed that when the hole barrier height was equal to or less than 300 meV, carrier injection efficiency as high as more than 0.8 would be achieved on calculation.

Figure 9A:
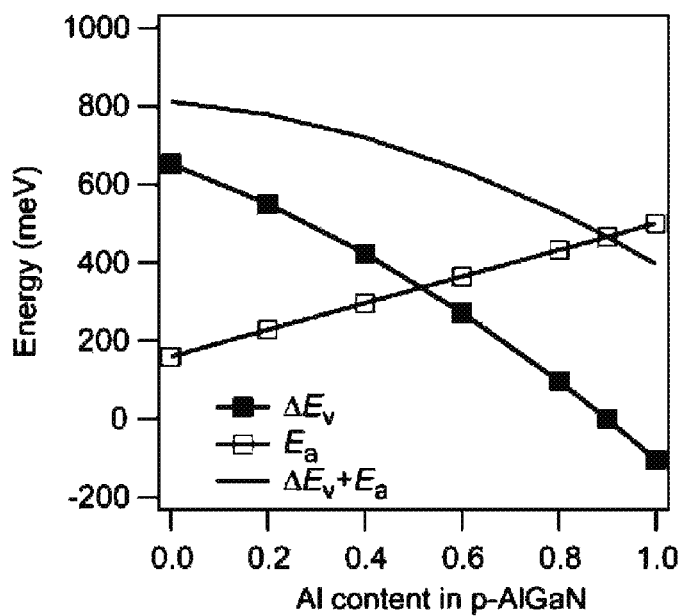
FIG. 9A is a graph showing the dependences of a valence band offset at a band lineup and Mg activation energy on the aluminum mole fraction y of the $Al_yGa_{1-y}N$ layer according to the embodiment of the present invention.
Figure 9C:
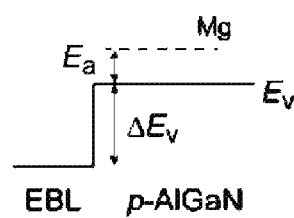
FIG. 9C is a schematic representation showing the valence band offset and a relationship between the Mg activation energy and the energy level of the valence band.

Next, it will be described in detail what should be the cause of the dependence of the hole barrier height on the aluminum mole fraction y of the p-type contact layer 150 as shown in FIG. 7. FIG. 9A shows the sum $\Delta E_v+E_a$, where $\Delta E_v$ indicates the band offset of the valence band (hereinafter referred to as a "valence band offset") at the interface between the EBL 138 and the p-type contact layer 150 and $E_a$ indicates the Mg activation energy, as a function of the aluminum mole fraction y of the p-type contact layer 150. FIG. 9C is a schematic representation showing a relationship between $\Delta E_v$, $E_a$ and the energy level ($E_v$) of the valence band. The quasi-Fermi level of holes is proportional to the Mg acceptor level at an extreme where the quasi-Fermi level of holes is approximate to the quasi-Fermi level of holes in bulk. Thus, $\Delta E_v+E_a$ would give an indication of the hole barrier height at the interface between the EBL 138 and the p-type contact layer 150.

Figure 9B:
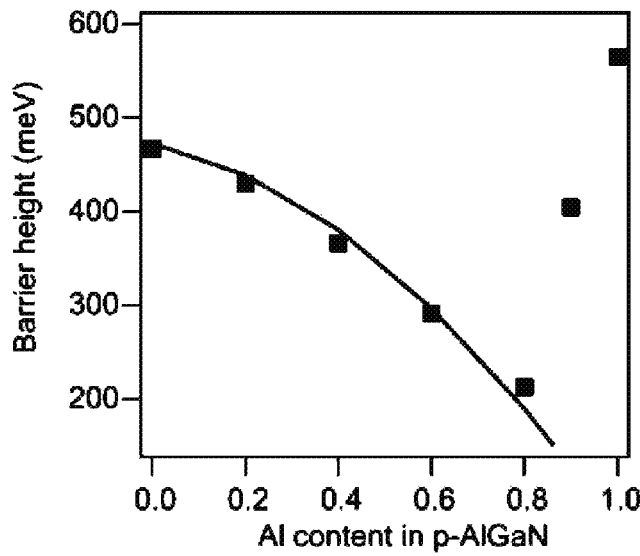
FIG. 9B is a graph showing, in superposition, the sum of the valence band offset and the Mg activation energy and the dependence of the hole barrier height on the aluminum mole fraction shown in FIG. 7.

As can be seen from FIG. 9A, as the aluminum mole fraction y increases from zero to one, the activation energy ($E_a$) increases from 160 meV to 500 meV. Thus, it is presumed that the increase in aluminum mole fraction y would actually act to cause an increase in barrier height and a decrease in hole concentration. However, as the aluminum mole fraction y increases, the valence band offset ($\Delta E_v$) decreases at a higher rate than the rate of increase in activation energy ($E_a$). As a result, $\Delta E_v+E_a$ decreases as the aluminum mole fraction y increases. In FIG. 9B, $\Delta E_v+E_a$ is drawn in a solid curve along with the re-plotted barrier height (see FIG. 7). In FIG. 9B, the $\Delta E_v+E_a$ value has been shifted by 320 meV in accordance with band bending. As can be seen from FIG. 9B, the variation in $\Delta E_v+E_a$ value perfectly reproduces the variation in hole barrier height. Based on these results, the present inventors confirmed that the decrease in hole barrier height with the increase in aluminum mole fraction y resulted from a decrease in valence band offset between the EBL 138 and the p-type contact layer 150.

As can be seen from the foregoing description, the phenomenon that the hole barrier height increases steeply once the aluminum mole fraction y exceeds 0.8 is produced by a different mechanism than the decrease in valence band offset between the EBL 138 and the p-type contact layer 150. Yet the present inventors still confirmed that the barrier height would give an indication of the hole injection efficiency as shown in FIG. 8. Thus, it is important to adjust the hole barrier height in order to improve the hole injection efficiency.

4. BANDGAP

As described above, it was confirmed that decreasing the hole barrier height in the EBL 138 caused an increase in carrier injection efficiency (see FIG. 8). However, the hole barrier height steeply increases once the aluminum mole fraction y of the p-type contact layer 150 exceeds 0.8, and reaches its maximum value (see FIG. 7) when the aluminum mole fraction y of the p-type contact layer 150 becomes equal to one after having exceeded 0.9, which is as large as the aluminum mole fraction y of the EBL 138. As described above, the increase in the barrier height at a composition with an aluminum mole fraction y greater than 0.8 would be caused by a different mechanism than the decrease in valence band offset between the EBL 138 and the p-type contact layer 150.

The present inventors paid attention to the slope of the conduction band of the EBL 138. Look at FIGS. 2A-5A in this order, and it can be seen that in the range where 124 nm≤z≤140 nm, the slope of the conduction band is diagonally right up when the aluminum mole fraction y of the p-type contact layer 150 is each of 0, 0.4, and 0.8 (see FIGS. 2A, 3A, and 4A) but diagonally right down when the aluminum mole fraction y is 1 (see FIG. 5A). In this case, when the p-type contact layer 150 has an aluminum mole fraction y of 0.8, almost all carriers would presumably be recombined in the light-emitting layer 134 (see FIG. 4B). On the other hand, when the aluminum mole fraction y of the p-type contact layer 150 is 1.0, almost all carriers would presumably pass through the light-emitting layer 134 without being recombined (see FIG. 5B). This means that when the aluminum mole fraction y is less than 0.9, which is the aluminum mole fraction y of the EBL 138, the EBL 138 performs its intended function of electron blocking, i.e., blocking electrons coming from the light-emitting layer 134, but that when the aluminum mole fraction y becomes greater than 0.9, the EBL 138 lets the electrons pass through it. The diagonally right down conduction band of the EBL 138 plays the role of decreasing the substantial thickness of the EBL 138 for electrons moving rightward in FIG. 5A. Thus, the electron blocking function of the EBL 138 rapidly declines once the aluminum mole fraction y of the p-type contact layer 150 exceeds 0.8. As can be seen, the relation in bandgap level between the p-type contact layer 150 and the EBL 138 determines how the conduction band of the EBL 138 is joined to the p-type contact layer 150 at their interface, thus determining the effects of the EBL 138 on electrons by the slope shape of the conduction band in the EBL 138. As used herein, the effects of the EBL 138 on electrons mean the electron blocking function, i.e., the EBL's 138 function of blocking electrons. In other words, the heterojunction between the EBL 138 and the p-type contact layer 150 determines the respective slope shapes (band shapes) of the conduction and valence bands of the EBL 138. The slope shape of the conduction band of the EBL 138 determines the EBL's 138 electron blocking function.

Figure 3A:
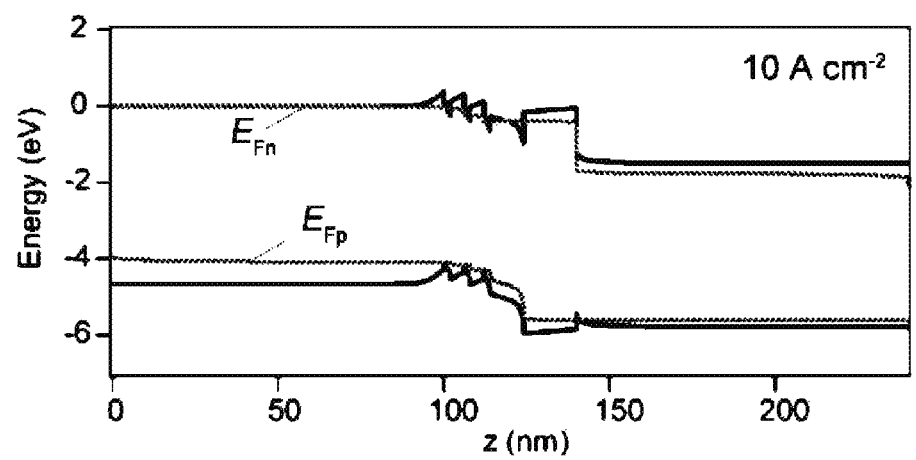
Figure 3B:
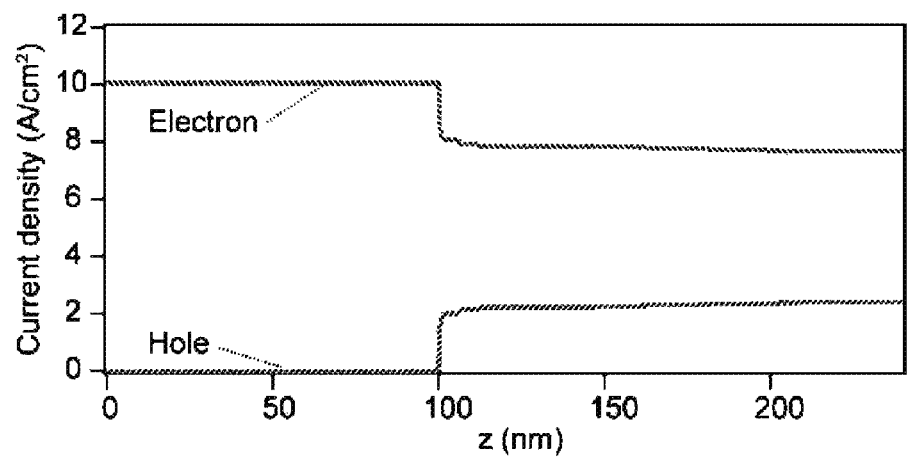
FIG. 3B is a graph showing a current density distribution with respect to levels in the thickness direction for the multilayer stack, including the p-type contact layer implemented as the p-type $Al_yGa_{1-y}N$ layer with an aluminum mole fraction y=0.4, and showing results of simulation of the UV LED according to the embodiment of the present invention.
Figure 4A:
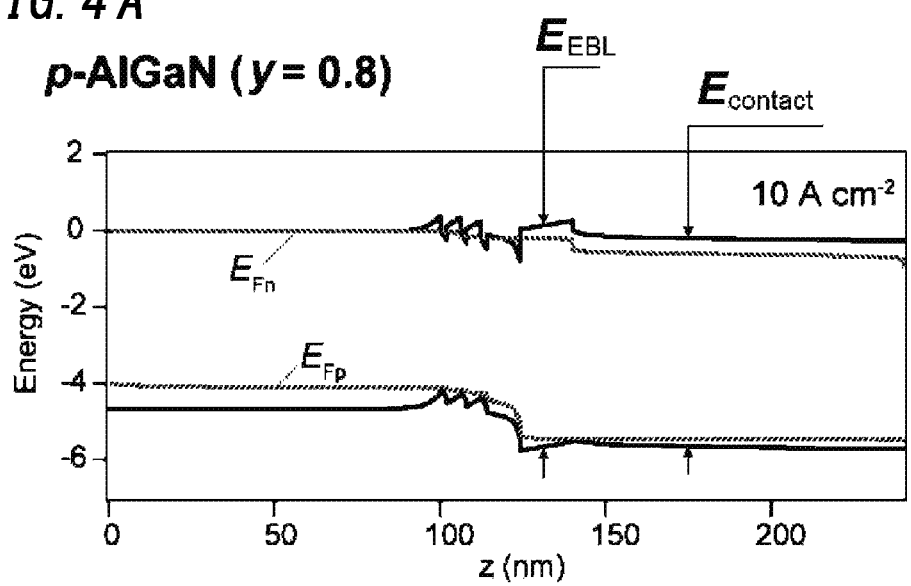
Figure 4B:
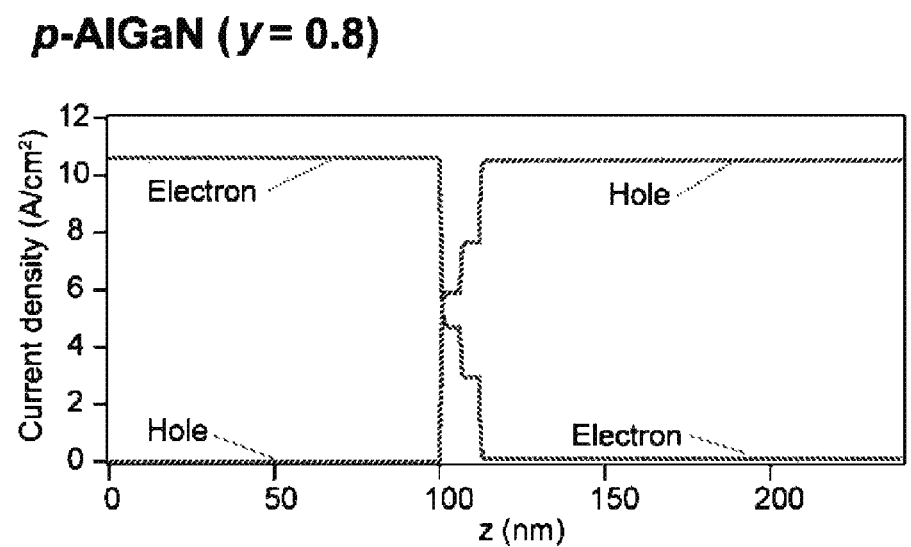
FIG. 4B is a graph showing a current density distribution with respect to levels in the thickness direction for the multilayer stack, including the p-type contact layer implemented as the p-type $Al_yGa_{1-y}N$ layer with an aluminum mole fraction y=0.8, and showing results of simulation of the UV LED according to the embodiment of the present invention.

Specifically, when the bandgap of the p-type contact layer 150 becomes higher than the bandgap of the EBL 138, the electrons injected from the n-type conductive layer 132 into the light-emitting layer 134 leak through the EBL 138, thus causing a significant decline in carrier injection efficiency to recombine electrons and holes in the light-emitting layer 134. Thus, the UV LED element 100 is able to operate while curbing a decrease in carrier injection efficiency when the bandgap energy of the EBL 138 satisfies $$E_{contact} \leq E_{EBL}.$$

where $E_{EBL}$ designates the bandgap energy of the EBL 138 and $E_{contact}$ indicates the bandgap energy of the p-type contact layer 150. $E_{EBL}$ and $E_{contact}$ have their values determined by the respective levels of the EBL 138 and the p-type contact layer 150 in the thickness direction of the multilayer stack including the p-type contact layer 150 as in the example illustrated in FIG. 4A. In this case, $E_{EBL}$ and $E_{contact}$ each represent the energy difference between the conduction band and the valence band, and therefore, are substantially constant in a range where the chemical composition is the same. Furthermore, in the UV LED, if the hole concentration of the p-type contact layer 150 decreases as the aluminum mole fraction y of the p-type contact layer 150 increases, then electrons will be in charge of electrical conduction, and a much smaller number of holes will be injected into the light-emitting layer 134. As for the above-described reason why the hole barrier height of the EBL 138 increases in the EBL 138, this phenomenon should arise presumably because the valence band of the EBL 138 is affected by the level of the conduction band of the p-type contact layer 150 at the junction and lowered to a lower energy level when their electron energy levels are compared with each other, thus raising the level of the valence band (i.e., the value in the downward direction on the paper on which FIG. 3A or 4A is drawn, or the energy level of the valence band when their hole energy levels are compared). Therefore, this reasoning is not contradictory to the above description about the hole injection efficiency.

Next, it will be described how to give the bandgap energies $E_g$ of the EBL 138 and the p-type contact layer 150 in carrying out numerical simulation. According to the numerical simulation, if the chemical compositions of the EBL 138 and the p-type contact layer 150 are represented by the general formula $In_xAl_yGa_{1-x-y}N$, the bandgap energy Eg (x, y) is given by the following approximation formula:

$$E_g(x,y) = x \cdot E_g^{InN} + y \cdot E_g^{AlN} + (1-x-y) \cdot E_g^{GaN} - b_{Al-In} \cdot x \cdot y - b_{Al-Ga} \cdot (1-x-y) \cdot y - b_{Ga-In} \cdot x \cdot (1-x-y)$$

where $E_g^{InN}$, $E_g^{AlN}$, and $E_g^{GaN}$ indicate the respective bandgap energies of InN, AlN, and GaN, and $b_{Al-In}$, $b_{Al-Ga}$, and $b_{Ga-In}$ are bowing parameters for use to determine the degree of deviation from linear interpolation.

These $E_g^{InN}$, $E_g^{AlN}$, and $E_g^{GaN}$ values and $b_{Al-In}$, $b_{Al-Ga}$, and $b_{Ga-In}$ values for use in this approximation formula should ideally be accurate enough to simulate real things. Actually, however, it is a practical choice to adopt values according to reliable documents. Nevertheless, each of these values varies according to the document to reply on as well. Furthermore, the bandgap energy exhibits such dependence that makes the energy decline as the temperature rises. For example, a representative document such as I. Vurgaftman and J. R. Meyer, "Band parameters for nitrogen-containing semiconductors," J. Appl. Phys. 94, 3675-3696, 2003 (hereinafter referred to as "Document 1") reports that the bandgap energies at temperatures of 0 K and 300 K are:

$E_g^{AlN}$=6.25 eV (0 K), 6.21 eV (300 K)
$E_g^{GaN}$=3.51 eV (0 K), 3.43 eV (300 K)
$E_g^{InN}$=0.78 eV (0 K), 0.76 eV (300 K)

Each of the $b_{Al-In}$, $b_{Al-Ga}$, and $b_{Ga-In}$ values also varies from one document to another. For example, Document 1 recommends 0.7 eV as $b_{Al-Ga}$. According to another document (M. Androulidaki et al., "Energy gaps and bowing parameters of InAlGaN ternary and quaternary alloys," Phys. Stat. Sol. (c) 3, No. 6, 1866-1869, 2006 (hereinafter referred to as "Document 2"), $b_{Al-Ga}$ is 1.0 eV.

Thus, in the UV LED 100 according to this embodiment, a value at 300 K is supposed to be adopted as a bandgap energy value unless otherwise stated. Furthermore, according to the simulation software ("SiLENSe") used for calculations, the approximation formula using the following values is adopted:

$E_g^{AlN}$=6.158 eV
$E_g^{GaN}$=3.438 eV
$E_g^{InN}$=0.642 eV
$b_{Al-Ga}$=1.0 eV
$b_{Ga-In}$=1.2 eV
$b_{Al-In}$=4.5 eV

When the analysis was carried out based on this numerical simulation, these values were adopted as they are. Note that these bandgap energies were measured at a temperature of 300 K (room temperature). Also, the bandgap energies adopted for the numerical simulation are supposed to be values at a temperature of 300 K unless stated otherwise. It is noteworthy that according to the present application, the relation in the magnitude of the bandgap energy and requirements to be determined by numerical values themselves are not satisfied only at 300 K but that the expected operation will be achieved if the respective requirements are satisfied at some local temperatures of the UV LED element 100 during the operation of the UV LED element 100.

The designed properties of AlGaN that have been described based on the aluminum mole fraction need to be modified accordingly if its composition includes In. In other words, the properties of InAlGaN are different from those of AlGaN. However, particularly when the EBL 138 and the p-type contact layer 150 are characterized with special attention paid to the energy bandgap, there is no need to make such modifications. Even if the indium mole fraction x of the approximation formula is set at a value other than zero, the above statement about the energy bandgaps of the EBL 138 and the p-type contact layer 150 is applicable as it is. This is one of the reasons why the present inventors believe that it is the bandgap energy, rather than the composition such as the aluminum mole fraction or the indium mole fraction, that determines the carrier injection efficiency.

Another reason why the behavior of carriers that pass through the heterojunction between semiconductor layers with different chemical compositions is determined by the bandgap energy is that the energy difference (band offset) between the band edges at the heterojunction is also presumable by the bandgaps of the two layers with the different chemical compositions on both sides of the heterojunction. For holes, what gives the band offset is the valence band offset ($\Delta E_v$) described above. At the heterojunction between two semiconductor layers with different chemical compositions, the sum of the value of this valence band offset ($\Delta E_v$) and the value of the conduction band offset ($\Delta E_c$) that gives a band offset for electrons accounts for the difference ($\Delta E_g$) in bandgap between the two layers on both sides of the heterojunction. That is to say, the following equation:

$$\Delta E_c + \Delta E_v = \Delta E_g$$

is satisfied. The ratio of allocating the bandgap difference ($\Delta E_g$) between the valence band offset ($\Delta E_v$) and the conduction band offset ($\Delta E_c$) may be regarded, as a rule of thumb, as invariable in the entire range of the AlN—GaN compound crystal composition. Even in the numerical simulation, the following relation $$\Delta E_v = 0.29 \Delta E_g$$

is supposed to be satisfied in the entire range of the AlN—GaN compound crystal composition. That is to say, the relation that the carrier behavior is determined by the bandgap energies of the semiconductor layers on both sides of the heterojunction is guaranteed based on the rule of thumb.

When special attention is paid to the bandgap, exemplary embodiments of the UV LED element 100 may be provided by various additional relations defined. Specifically, in the UV LED element 100, when the bandgap energy of the p-type contact layer 150 satisfies $E_{emission} < E_{contact}$ where $E_{contact}$ designates the bandgap energy of the p-type contact layer 150 and $E_{emission}$ designates the photon energy of light emitted from the light-emitting layer 134, the p-type contact layer 150 becomes transparent to the light emitted from the light-emitting layer 134. Thus, the light (ultraviolet ray) emitted from the light-emitting layer 134 is not absorbed into the p-type contact layer 150, thus improving the luminous efficacy of the UV LED element 100.

Furthermore, in another exemplary embodiment of the UV LED element 100, the aluminum mole fraction y of the p-type contact layer 150 is such a value that allows the bandgap energy of the p-type contact layer 150 to satisfy the inequality 4.83 eV $\leq E_{contact} \leq$ 5.45 eV, where $E_{contact}$ designates the bandgap energy of the p-type contact layer 150. Setting the aluminum mole fraction y of the p-type contact layer 150 at such a value would improve the luminous efficacy particularly significantly. Such an aluminum mole fraction y of the p-type contact layer 150 falls on the range of 0.6 to 0.8 when the indium mole fraction is small.

In still another exemplary embodiment of the UV LED element 100, $E_{EBL} - E_{contact}$ satisfies $0 \leq E_{EBL} - E_{contact} \leq 0.966$ eV, where $E_{contact}$ designates the bandgap energy of the p-type contact layer 150 and $E_{EBL}$ designates the bandgap energy of the EBL 138. When having such a composition that allows the p-type contact layer 150 and the EBL 138 to satisfy this condition, the UV LED element 100 would operate as properly as confirmed by the simulation. If the EBL 138 is specifically implemented to have a single barrier with an aluminum mole fraction of 0.9 as in the simulation described above, the aluminum mole fraction y of such a p-type contact layer 150 falls on the range of 0.6 to 0.8. Note that in this mole fraction range, $E_{EBL} - E_{contact} = 0.966$ eV, because $E_{EBL}$ becomes 5.796 eV when the EBL 138 implemented as a single barrier (AlGaN layer) has an aluminum mole fraction of 0.9 and because $E_{contact}$ becomes 4.830 eV when the p-type contact layer 150 has an aluminum mole fraction of 0.6.

In yet another exemplary embodiment, the n-type conductive layer 132 has a bandgap energy of 4.5 eV or more. In that case, the n-type conductive layer 132 will have an optical transmittance of 80% or more with respect to light with a wavelength of 300 nm. This allows the UV LED element 100 to improve its light extraction efficiency, because the n-type conductive layer 132 becomes transparent to the light emitted from the light-emitting layer 134. The n-type conductive layer 132 satisfying the condition that its bandgap energy should be equal to or greater than 4.5 eV may be obtained by setting the aluminum mole fraction at 0.5 or more when the indium mole fraction is small. The n-type conductive layer 132 more suitably has a bandgap energy of 6.2 eV or less. This allows the UV LED element 100 to include the n-type conductive layer 132 of a material with an appropriate chemical composition for any aluminum mole fraction falling within a range from 0.5 to 1. Note that even making the n-type conductive layer 132 of a material that would make the bandgap energy greater than 6.2 eV would not further increase the transparency in the range of light used in practice as a deep ultraviolet range. This is because the wavelength of the light with a photon energy of 6.2 eV can be said to be the shortest wavelength in the deep ultraviolet range with respect to the wavelength of the ultraviolet ray emitted from the light-emitting layer of an AlGaN-based material.

5. MULTI-QUANTUM BARRIER (MQB) LAYER

The foregoing description is applicable with only minor modifications to even a situation where the EBL 138 is implemented as an MQB layer. In that case, to apply the MQB layer appropriately in practice, details of the MQB layer designed to increase a substantial electron barrier height are taken into consideration. That is to say, examples of design parameters that affect the substantial barrier height of the actual MQB layer include how long the period of the MQB should be, whether or not a plurality of MQB periods are included, the overall thickness of the MQB layer, the conduction band slope of the MQB layer, and the compositions of respective layers of the MQB layer. Still, in an embodiment in which the EBL 138 is implemented as an MQB layer, a maximum value of the bandgap energy of the MQB layer suitably satisfies $$E_{contact} \leq E_{MQB\text{-}max}$$

where $E_{MQB\text{-}max}$ designates the maximum value of the bandgap energy of the MQB layer to replace the bandgap energy $E_{EBL}$ and $E_{contact}$ designates the bandgap energy of the p-type contact layer 150. This allows the UV LED element 100 to operate while curbing the decline in carrier injection efficiency, thus promoting the recombination of carriers in the light-emitting layer 134 and improving the luminous efficacy. Optionally, instead of the maximum bandgap energy of the MQB layer, the average bandgap energy of the respective bandgaps of the multiple layers included in the MQB layer is suitably equal to or greater than the bandgap energy ($E_{contact}$) of the p-type contact layer 150, because the MQB layer would achieve further enhanced electron blocking function in that case.

6. EXAMPLES

Next, the present invention will be described in further detail by way of illustrative examples in which the knowledge acquired through the simulation described above was verified in an actual UV LED element. In the following illustrative examples, the operation of a UV LED element, of which the manufacturing condition was modified as far as the knowledge acquired through the simulation could be made full use of, was confirmed. The present inventors separately confirmed that the UV LED element could actually operate as expected through the simulation described above. That is why in the following illustrative examples, the UV LED element was not always fabricated under the same condition as the condition calculated by the simulation. The materials, amount of use, ratios, contents and procedure of processing, and orientations and specific arrangement of elements or members to be described in the following illustrative examples may be modified as appropriate without departing from the true spirit and scope of the invention. Therefore, it should be appreciated that the scope of the present invention is not limited to the following illustrative examples, which will be described with reference to the drawings that have already been referred to and using the same reference signs as those used in the foregoing description.

6-1. First Example

An ultraviolet light-emitting module including the UV LED element 100 was fabricated. An exemplary method for fabricating such an ultraviolet light-emitting module will be described.

First of all, a single-crystal sapphire substrate ($\alpha$-$Al_2O_3$ substrate) is provided. In this case, the sapphire substrate has a first surface and a second surface, both of which intersect with the thickness direction of the sapphire substrate at right angles. The first surface of the sapphire substrate may have an off-axis angle of 0.20 degrees with respect to a (0001) plane, for example.

After the sapphire substrate has been provided, the sapphire substrate is loaded onto a susceptor in a reaction furnace of a metalorganic vapor phase epitaxy (MOVPE) system. Thereafter, with hydrogen ($H_2$ gas) supplied as a carrier gas into the furnace of the MOVPE system, the furnace is warmed up until the in-furnace temperature reaches 1100° C. and the in-furnace pressure reaches 10 kPa, when a nitride semiconductor thin film starts to be formed. In this case, the nitride semiconductor thin film may be an AlN undercoat layer (to be the buffer layer 120), which will be an undercoat for the n-type conductive layer 132. Also, the in-furnace temperature is the temperature of the substrate. The temperature of the substrate may, but does not have to, be determined by measuring, with a thermocouple, the temperature of the susceptor that holds the sapphire substrate in the furnace of the MOVPE system. While the nitride semiconductor thin film is being deposited, the in-furnace temperature and the in-furnace pressure are kept constant at 1100° C. and 10 kPa, respectively. After the in-furnace condition (including the substrate temperature and pressure) has been stabilized, trimethylaluminum (TMA) as a group III source is continuously supplied into the furnace at 50 sccm (standard cc per minute) and $NH_3$ gas as a group V source is supplied on and off as pulses (i.e., intermittently) into the furnace at 100 sccm, thereby forming islands of AlN crystal nuclei, which may have a height of approximately 20 nm. In short, those islands of AlN crystal nuclei with a height of about 20 nm are formed by continuously supplying TMA into the furnace at a flow rate of 50 sccm and by intermittently supplying $NH_3$ into the furnace at a flow rate of 100 sccm. Next, after the temperature of the substrate has been raised to 1300° C. with only the carrier gas ($H_2$ gas) supplied into the furnace, not only the carrier gas but also TMA as a group III source and $NH_3$ as a group V source are continuously supplied simultaneously into the furnace at 200 sccm and 400 sccm, respectively, thereby forming an AlN undercoat layer to an overall thickness of about 4 µm. The AlN undercoat layer formed by this method had a (10-12) plane thereof separately subjected to a ω scan of an X-ray diffraction analysis. As a result, the full width at half maximum (FWHM) of the X-ray rocking curve (XRC) was measured approximately 350 arcsec.

After the AlN undercoat layer has been formed, the in-furnace temperature is lowered from 1300° C. to 1100° C. with only the carrier gas ($H_2$ gas) supplied into the furnace, and TMA and trimethylgallium (TMG) as group III sources are supplied into the reaction furnace at 50 sccm and 20 sccm, respectively, tetraethylsilane (TESi) as an n-type dopant source is supplied at 3 sccm, and $NH_3$ as a group V source is supplied at 2 SLM, thereby forming an n-type conductive layer 132 to an overall thickness of 1.5 µm. The resultant AlGaN; Si layer, serving as the n-type conductive layer, had an Al composition (aluminum mole fraction) of about 0.60.

After the n-type conductive layer 132 has been formed, TMA and TMG as group III sources are supplied into the furnace at 50 sccm and 20 sccm, respectively, and $NH_3$ as a group V source is supplied into the furnace at 2 SLM (standard liters per minute) with the in-furnace temperature maintained, thereby forming a barrier layer to a thickness of approximately 10 nm. The AlGaN layer thus formed, serving as a barrier layer, had an Al composition (aluminum mole fraction) of 0.60. Next, TMA and TMG as group III sources are supplied into the furnace at 50 sccm and 30 sccm, respectively, and $NH_3$ as group V source is supplied at 2 SLM, thereby forming a quantum well (well layer) to a thickness of approximately 2 nm. The AlGaN layer thus formed, serving as a well layer, had an Al composition (aluminum mole fraction) of approximately 0.45. Furthermore, a light-emitting layer 134 with a multi-quantum well structure including four well layers is formed by alternately stacking these barrier layers and well layers upon each other.

Furthermore, an electron block layer (EBL) 138 is formed as a multi-quantum barrier (MQB) layer. In other words, an EBL 138 with an MQB structure is formed. Specifically, the EBL 138 is formed in the following manner. After the light-emitting layer 134 with the multi-quantum well structure has been formed, TMA and TMG as group III sources are supplied into the furnace at 50 sccm and 3 sccm, respectively, bis(cyclopentadienyl) magnesium ($Cp_2Mg$) as p-type dopant source is supplied at 100 sccm, and $NH_3$ as a group V source is supplied at 2 SLM with the in-furnace temperature maintained, thereby forming a first electron block layer to a thickness of about 10 nm. Next, TMA and TMG as group III sources are supplied into the furnace at 50 sccm and 20 sccm, respectively, $Cp_2Mg$ as a p-type dopant source is supplied at 100 sccm, and $NH_3$ as a group V source is supplied at 2 SLM, thereby forming a second electron block layer to a thickness of about 2 nm. In the same way, TMA and TMG as group III sources are supplied into the furnace at 50 sccm and 3 sccm, respectively, $Cp_2Mg$ as a p-type dopant source is supplied at 100 sccm, and $NH_3$ as a group V source is supplied at 2 SLM, thereby forming a third electron block layer to a thickness of about 8 nm. Furthermore, TMA and TMG as group III sources are supplied into the furnace at 50 sccm and 20 sccm, respectively, $Cp_2Mg$ as a p-type dopant source is supplied at 100 sccm, and $NH_3$ as a group V source is supplied at 2 SLM, thereby forming a fourth electron block layer to a thickness of about 10 nm. In this manner, an EBL 138 with an MQB structure in which the first to fourth electron block layers are stacked upon each other is formed. The respective AlGaN layers of the first, second, third, and fourth electron block layers thus formed, serving as the EBL 138 with the MQB structure, had Al compositions (aluminum mole fractions) of about 0.94, about 0.60, about 0.94, and about 0.60, respectively.

Subsequently, right after the EBL 138 with the MQB structure has been formed, a p-type contact layer 150 is formed. After the EBL 138 has been formed, TMA and TMG as group III sources are supplied into the furnace at 25 sccm and 3 sccm, respectively, $Cp_2Mg$ as a p-type dopant source is supplied at 100 sccm, and $NH_3$ as a group V source is supplied at 2 SLM with the in-furnace temperature maintained, thereby forming a p-type contact layer 150 to a thickness of about 50 nm. The AlGaN layer thus formed, serving as the p-type contact layer 150, had an Al composition (aluminum mole fraction) of approximately 0.80.

After the p-type contact layer 150 has been formed, the substrate temperature is lowered to room temperature with only the carrier gas ($H_2$ gas) supplied into the furnace. Thereafter, a wafer, in which a multilayer stack has been formed on the sapphire substrate (i.e., a sapphire wafer) is unloaded from the MOVPE system, and then subjected to a heat treatment at 800° C. for 20 minutes within an $N_2$ atmosphere in an annealing system. In this case, the multilayer stack is a nitride semiconductor thin film in which the buffer layer 120, the n-type conductive layer 132, the light-emitting layer 134, the EBL 138, and the p-type contact layer 150 are stacked in this order upon each other.

After the heat treatment, the p-type contact layer 150, the EBL 138 with the MQB structure, and the light-emitting layer 134 are partially removed by photolithography and dry etching techniques, thereby partially exposing the n-type conductive layer 132. Next, an n-side electrode 140, a p-side electrode 160, and a pad electrode (not shown) are formed by photolithography and lift-off methods. The pad electrode may be used to do electrical connection and bonding during the assembling process to be described later. The n-side electrode 140 is formed by sequentially depositing an Al thin film to a thickness of 100 nm, an Ni thin film to a thickness of 20 nm, and an Au thin film to a thickness of 100 nm on an exposed portion of the n-type conductive layer 132 and then conducting a heat treatment at 700° C. for one minute within an $N_2$ atmosphere. The p-side electrode 160 is formed by sequentially depositing an Ni thin film to a thickness of 2 nm and an Al thin film to a thickness of 200 nm in this order on an exposed portion of the p-type contact layer 150. The pad electrode is formed by sequentially depositing a Ti thin film to a thickness of 50 nm and an Au thin film to a thickness of 1000 nm in this order on each of the n-side electrode 140 and the p-side electrode 160.

Thereafter, the wafer on which the pad electrode and underlying members have been assembled together is diced into a plurality of UV LED elements 100 such that the UV LED elements 100 each have a square shape of 400 µm each side in a plan view. Subsequently, one of the plurality of UV LED elements 100 is flip-chip bonded onto a sub-mount, and an amorphous fluorine resin is applied to cover the UV LED element 100. After having been left at room temperature for one hour, the assembly is subjected to a heat treatment at 100° C. for one hour and then at 180° C. for 30 minutes, thus curing the amorphous fluorine resin and thereby completing an ultraviolet light-emitting module including the UV LED element 100.

This ultraviolet light-emitting module was supplied with a DC current of 20 mA. As a result, the highest level emission performance, including a wavelength of 276 nm, an optical output power of 6.5 mW, and a luminous efficacy of 7.2%, was achieved in the deep ultraviolet region. Also, when this ultraviolet light-emitting module was supplied with a DC current of 1 mA, the luminous efficacy was 9.0%.

6-2. Second Example

After a UV LED element 100 has been fabricated in the same way as in the first example, six elements are electrically connected together in parallel and flip-chip bonded on a sub-mount. Subsequently, an amorphous fluorine resin is applied to cover those six elements entirely and then allowed to cure in the same curing condition as in the first example, thus fabricating an ultraviolet light-emitting module to operate with high output power. When this ultraviolet light-emitting module was supplied with a DC current of 120 mA, emission characteristics including a wavelength of 277 nm and an optical output power of 40 mW were achieved.

7. OTHER EXEMPLARY EMBODIMENTS

The embodiment of the present invention described above is suitably implemented with numerous variations and modifications. For example, it is also recommended to set the Mg concentration of the p-type contact layer 150 at $1.0 \times 10^{18}$ cm$^{-3}$ or more. Setting the Mg concentration at this value or more would allow holes to be injected into the light-emitting layer 134 efficiently, thus improving the luminous efficacy. It is also recommended to set the Mg concentration of the p-type contact layer 150 at $1.0 \times 10^{21}$ cm$^{-3}$ or less. Around the time when the Mg concentration of the p-type contact layer exceeds about $10^{20}$ cm$^{-3}$, the crystallinity of the p-type contact layer 150 starts to decrease significantly and the hole concentration tends to increase less easily. That is why the Mg concentration of the p-type contact layer is suitably equal to or less than $1.0 \times 10^{21}$ cm$^{-3}$, because the luminous efficacy could be improved with good crystallinity maintained in such a range, and more suitably equal to or less than $1.0 \times 10^{20}$ cm$^{-3}$. Accordingly, in the UV LED element 100, the p-type contact layer 150 suitably has a hole concentration of $1.0 \times 10^{15}$ cm$^{-3}$ or more. Setting the hole concentration at this value or more would allow holes to be injected efficiently, thus improving the luminous efficacy. Also, since the hole concentration that tends to increase less easily is about $1.0 \times 10^{21}$ cm$^{-3}$ as described above, it is also recommended that the UV LED element operate at a hole concentration equal to or less than about $1.0 \times 10^{21}$ cm$^{-3}$.

As can be seen, defining the energy gap structure between the p-type contact layer 150 and the EBL 38 appropriately allows the UV LED element 100 to increase the carrier injection efficiency. This provides a UV LED element with improved external quantum efficiency.

The UV LED element 100 may be used as a component of an electric apparatus, for example. That is to say, such an electric apparatus includes the UV LED element 100 as a light source for emitting an ultraviolet ray and an apparatus body, thus contributing to enhancing the performance of an electric apparatus that uses a UV LED.

Examples of such electric apparatuses include a vacuum cleaner 200 such as the one shown in FIG. 10. The vacuum cleaner 200 includes a cleaner body (apparatus body) 201, a hose 202 connected to a suction port of the cleaner body 201, a connection pipe 203 provided at the end of the hose 202, and a cleaner head 204 provided at the end of the connection pipe 203. The cleaner head 204 includes a suction port for sucking dust. The cleaner head 204 may include a brush. In the cleaner body 201, built in are an electric blower for sucking air with dust, and a dust collector 206 for collecting dust therein. This vacuum cleaner 200 includes two ultraviolet light-emitting devices 220, each including a plurality of UV LED elements 100 housed in a single package 210. One of the two ultraviolet light-emitting devices 220 is built in the cleaner head 204, while the other ultraviolet light-emitting device 220 is built in the cleaner body 201. The ultraviolet light-emitting device 220 built in the cleaner head 204 is arranged to emit an ultraviolet ray toward the suction port of the cleaner head 204. This allows the vacuum cleaner 200 to do cleaning while carrying out disinfection. The ultraviolet light-emitting device 220 built in the cleaner body 201 is arranged to emit an ultraviolet ray into the dust collector 206. This allows the vacuum cleaner 200 to disinfect not only the dust collector 206 but also air passing through the dust collector 206 as well. Alternatively, the vacuum cleaner 200 may also be configured to include only one of the two ultraviolet light-emitting devices 220. Also, the number of the ultraviolet light-emitting devices 220 built in does not have to be two.

Furthermore, such an electric apparatus including the UV LED element 100 as a light source for emitting an ultraviolet ray and an apparatus body does not have to be the vacuum cleaner 200 but may also be a refrigerator as well, for example.

Although embodiments of the present invention have been described specifically, those embodiments and exemplary configurations have been described for illustrative purposes only, and should not be construed as limiting. Rather the scope of the invention of the present application should be defined by the appended claims. It should also be noted that numerous modifications or variations, including other alternative combinations of the embodiments described above, can be readily made by those skilled in the art without departing from the true spirit and scope of the invention.

Aspects of the Present Invention

As is clear from the foregoing description of embodiments and examples, an ultraviolet light-emitting diode (100) according to a first aspect of the present invention includes: an n-type conductive layer (132) including an In$_{x1}$Al$_{y1}$Ga$_{1-x1-y1}$N layer (where 0≤x1<1 and 0<y1≤1); a light-emitting layer (134); an electron block layer (138) including an In$_{x2}$Al$_{y2}$Ga$_{1-x2-y2}$N layer (where 0≤x2<1 and 0<y2≤1); and a p-type contact layer (150) including an In$_{x3}$Al$_{y3}$Ga$_{1-x3-y3}$N layer (where 0≤x3<1 and 0<y3<1), all of which are arranged in this order. The ultraviolet light-emitting diode (100) satisfies E$_{contact}$≤E$_{EBL}$, where E$_{contact}$ designates bandgap energy of the p-type contact layer (150) and E$_{EBL}$ designates bandgap energy of the electron block layer (138).

An ultraviolet light-emitting diode (100) according to a second aspect of the present invention, which may be implemented in conjunction with the first aspect, satisfies E$_{emission}$<E$_{contact}$, where E$_{contact}$ designates the bandgap energy of the p-type contact layer (150) and E$_{emission}$ designates photon energy of light emitted from the light-emitting layer (134).

In an ultraviolet light-emitting diode (100) according to a third aspect of the present invention, which may be implemented in conjunction with the first aspect, an aluminum mole fraction y3 of the p-type contact layer (150) is such a value that allows the bandgap energy E$_{contact}$ of the p-type contact layer (150) to satisfy 4.83 eV≤E$_{contact}$≤5.45 eV.

An ultraviolet light-emitting diode (100) according to a fourth aspect of the present invention, which may be implemented in conjunction with the first aspect, satisfies 0 eV≤E$_{EBL}$− E$_{contact}$≤0.966 eV, where E$_{contact}$ designates the bandgap energy of the p-type contact layer (150) and E$_{EBL}$ designates the bandgap energy of the electron block layer (138).

In an ultraviolet light-emitting diode (100) according to a fifth aspect of the present invention, which may be implemented in conjunction with the first aspect, the electron block layer (138) is a multi-quantum barrier layer. The ultraviolet light-emitting diode (100) satisfies E$_{contact}$≤E$_{MQB-max}$, where E$_{contact}$ designates the bandgap energy of the p-type contact layer (150) and E$_{MQB-max}$ designates a maximum value of bandgap energy of the multi-quantum barrier layer.

In an ultraviolet light-emitting diode (100) according to a sixth aspect of the present invention, which may be implemented in conjunction with the first aspect, the p-type contact layer (150) has an Mg concentration within a range from $1.0 \times 10^{18}$ cm$^{-3}$ to $1.0 \times 10^{21}$ cm$^{-3}$.

In an ultraviolet light-emitting diode (100) according to a seventh aspect of the present invention, which may be implemented in conjunction with the first aspect, the p-type contact layer (150) has a hole concentration within a range from $1.0 \times 10^{15}$ cm$^{-3}$ to $1.0 \times 10^{21}$ cm$^{-3}$.

In an ultraviolet light-emitting diode (100) according to an eighth aspect of the present invention, which may be implemented in conjunction with the first aspect, the n-type conductive layer (132) has a bandgap energy within a range from 4.5 eV to 6.2 eV.

An electric apparatus (200) according to a ninth aspect of the present invention includes the ultraviolet light-emitting diode (100) according to any one of the first to eighth aspects as a light source for emitting an ultraviolet ray.

An ultraviolet light-emitting diode (100) according to a tenth aspect of the present invention includes: an n-type conductive layer (132) including an $In_{x1}Al_{y1}Ga_{1-x1-y1}N$ layer (where 0≤x1<1 and 0<y1≤1); a light-emitting layer (134); an electron block layer (138) including an $In_{x2}Al_{y2}Ga_{1-x2-y2}N$ layer (where 0≤x2<1 and 0<y2≤1); and a p-type contact layer (150) including an $In_{x3}Al_{y3}Ga_{1-x3-y3}N$ layer (where 0≤x3<1 and 0<y3<1), all of which are arranged in this order. The ultraviolet light-emitting diode has a hole barrier height of 300 meV or less. The hole barrier height is defined by an energy difference between a maximum value of valence band energy of the electron block layer (138) and a quasi-Fermi level value of holes.

A UV LED element according to the present invention may be used in any type of electric apparatus which produces an ultraviolet ray.

REFERENCE SIGNS LIST

100 UV LED element (ultraviolet LED element)
102 Light Extraction Surface
104 First Surface of Sapphire Substrate
110 Sapphire Substrate
120 Buffer Layer
132 N-Type Conductive Layer
134 Light-Emitting Layer
138 Electron Block Layer (EBL)
140 N-Side Electrode
150 P-Type Contact Layer
160 P-Side Electrode

The invention claimed is:

1. An ultraviolet light-emitting diode comprising:
an n-type conductive layer including an $In_{x1}Al_{y1}Ga_{1-x1-y1}N$ layer, where 0≤x1<1 and 0<y1≤1;
a light-emitting layer;
an electron block layer including an $In_{x2}Al_{y2}Ga_{1-x2-y2}N$ layer, where 0≤x2<1 and 0<y2<1;
a p-type contact layer, which is an $In_{x3}Al_{y3}Ga_{1-x3-y3}N$ layer, where 0≤x3<1 and 0<y3<1; and
a metal p-side electrode, all of which are arranged in this order,
a bandgap energy of the electron block layer satisfying $$E_{contact} \leq E_{EBL}$$

where $E_{contact}$ designates bandgap energy of the p-type contact layer and $E_{EBL}$ designates the bandgap energy of the electron block layer,
wherein
the metal p-side electrode is an optical reflector directly on the p-type contact layer, $E_{EBL}-E_{contact}$ satisfies $$0 \text{ eV} \leq E_{EBL}-E_{contact} \leq 0.966 \text{ eV}$$

where $E_{contact}$ designates the bandgap energy of the p-type contact layer and $E_{EBL}$ designates the bandgap energy of the electron block layer.

2. The ultraviolet light-emitting diode of claim 1, wherein the bandgap energy of the p-type contact layer satisfies $$E_{emission} < E_{contact}$$

where $E_{contact}$ designates the bandgap energy of the p-type contact layer and $E_{emission}$ designates photon energy of light emitted from the light-emitting layer.

3. The ultraviolet light-emitting diode of claim 1, wherein an aluminum mole fraction y3 of the p-type contact layer is such a value that allows the bandgap energy of the p-type contact layer to satisfy $$4.83 \text{ eV} \leq E_{contact} \leq 5.45 \text{ eV}$$

where $E_{contact}$ designates the bandgap energy of the p-type contact layer.

4. The ultraviolet light-emitting diode of claim 1, wherein the electron block layer is a multi-quantum barrier layer, and
a maximum value of bandgap energy of the multi-quantum barrier layer satisfies $$E_{contact} \leq E_{MQB-max}$$

where $E_{contact}$ designates the bandgap energy of the p-type contact layer and $E_{MQB-max}$ designates the maximum value of the bandgap energy of the multi-quantum barrier layer.

5. The ultraviolet light-emitting diode of claim 1, wherein the p-type contact layer has an Mg concentration within a range from $1.0 \times 10^{18}$ cm$^{-3}$ to $1.0 \times 10^{21}$ cm$^{-3}$.

6. The ultraviolet light-emitting diode of claim 1, wherein the p-type contact layer has a hole concentration within a range from $1.0 \times 10^{15}$ cm$^{-3}$ to $1.0 \times 10^{21}$ cm$^{-3}$.

7. The ultraviolet light-emitting diode of claim 1, wherein the n-type conductive layer has a bandgap energy within a range from 4.5 eV to 6.2 eV.

8. An electric apparatus comprising the ultraviolet light-emitting diode of claim 1 as a light source for emitting an ultraviolet ray.

9. The ultraviolet light-emitting diode of claim 1, wherein the electron block layer includes the $In_{x2}Al_{y2}Ga_{1-x2-y2}N$ layer, where x2=0 and 0<y2<1, and
the ultraviolet light-emitting diode has a hole barrier height of 300 meV or less, the hole barrier height being defined by an energy difference between a maximum value of valence band energy of the electron block layer and a quasi-Fermi level value of holes of the electron block layer.

10. An ultraviolet light-emitting diode comprising:
an n-type conductive layer including an $In_{x1}Al_{y1}Ga_{1-x1-y1}N$ layer, where 0≤x1<1 and 0<y1≤1;
a light-emitting layer;
an electron block layer including an $In_{x2}Al_{y2}Ga_{1-x2-y2}N$ layer where 0≤x2<1 and 0<y2≤1; and
a p-type contact layer including an $In_{x3}Al_{y3}Ga_{1-x3-y3}N$ layer where 0≤x3<1 and 0<y3<1,
all of which are arranged in this order,
a bandgap energy of the electron block layer satisfying $$E_{contact} \leq E_{EBL}$$

where $E_{contact}$ designates bandgap energy of the p-type contact layer and $E_{EBL}$ designates the bandgap energy of the electron block layer,
wherein
the electron block layer is a multi-quantum barrier layer, and a maximum value of bandgap energy of the multi-quantum barrier layer satisfies $$E_{contact} \leq E_{MQB\text{-}max}$$

where $E_{contact}$ designates the bandgap energy of the p-type contact layer and $E_{MQB\text{-}max}$ designates the maximum value of the bandgap energy of the multi-quantum barrier layer.

* * * * *